United States Patent
Shieh et al.

(10) Patent No.: US 6,872,667 B1
(45) Date of Patent: Mar. 29, 2005

(54) METHOD OF FABRICATING SEMICONDUCTOR DEVICE WITH SEPARATE PERIPHERY AND CELL REGION ETCHING STEPS

(75) Inventors: Chang-Jen Shieh, Hsinchu (TW); Hung-Cheng Sung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/721,979

(22) Filed: Nov. 25, 2003

(51) Int. Cl.⁷ .......................................... H01L 21/311
(52) U.S. Cl. ........................................................ 438/700
(58) Field of Search ................................ 438/700, 680, 438/681, 689, 692, 695, 697, 706, 733, 734, 735, 736, 744, 724

(56) References Cited

U.S. PATENT DOCUMENTS

| | | | |
|---|---|---|---|
| 6,110,780 A | * | 8/2000 | Yu et al. ............... 438/258 |
| 6,403,494 B1 | * | 6/2002 | Chu et al. ............... 438/719 |
| 6,448,608 B1 | | 9/2002 | Pham et al. |
| 6,461,906 B1 | * | 10/2002 | Lung ...................... 438/216 |
| 6,559,501 B2 | | 5/2003 | Sung et al. |

OTHER PUBLICATIONS

Oehrlein, G.S., et al., "Surface Science Issues in Plasma Etching," [on–line] IBM Journal of Research and Development, vol. 43, ½ (1999), Retrieved From: http://www.research.ibm.com/journal/rd/431/oehrlein.html.
"Technical Comparison of Floating Gate Reprogrammable Nonvolatile Memories," Technical Paper, Silicon Storage Technology, Inc. (Nov. 2001) pp. 1–8.

* cited by examiner

*Primary Examiner*—David Nhu
(74) *Attorney, Agent, or Firm*—Slater & Matsil, L.L.P.

(57) ABSTRACT

Methods of fabricating semiconductor devices using separate periphery and cell region etching steps are provided. A substrate is provided, wherein the substrate has a cell region and a periphery region separated by a shallow trench isolation (STI). The STI is filled with a dielectric material. A protective layer is formed on the periphery region, allowing semiconductor structures to be formed in the cell region without damaging the surface of the periphery region. Upon forming the semiconductor structures in the cell region, a portion of the dielectric material in the STI adjacent to the cell region is partially removed. The dielectric material adjacent to the periphery region is substantially unetched.

23 Claims, 3 Drawing Sheets

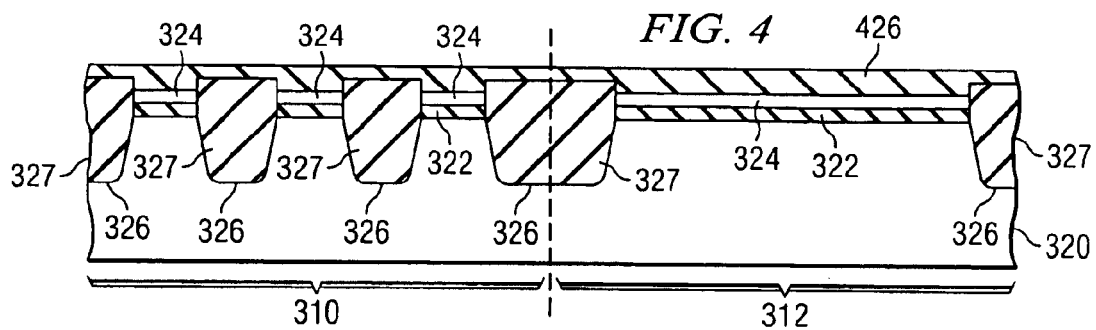
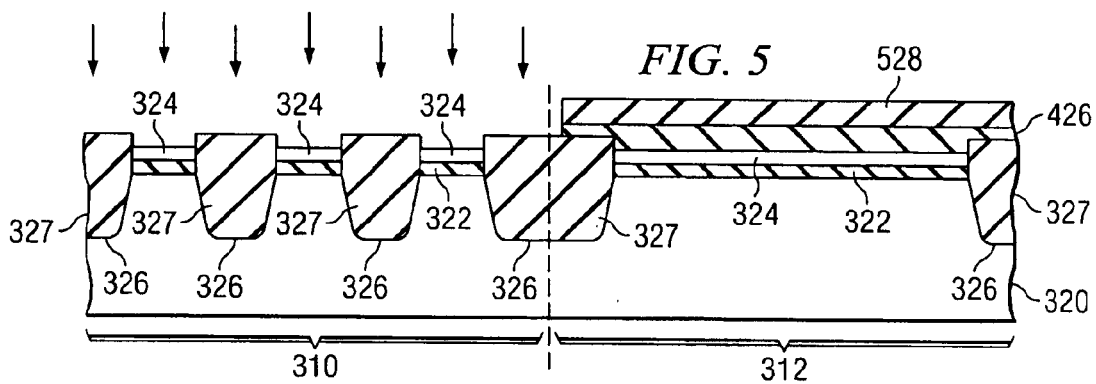
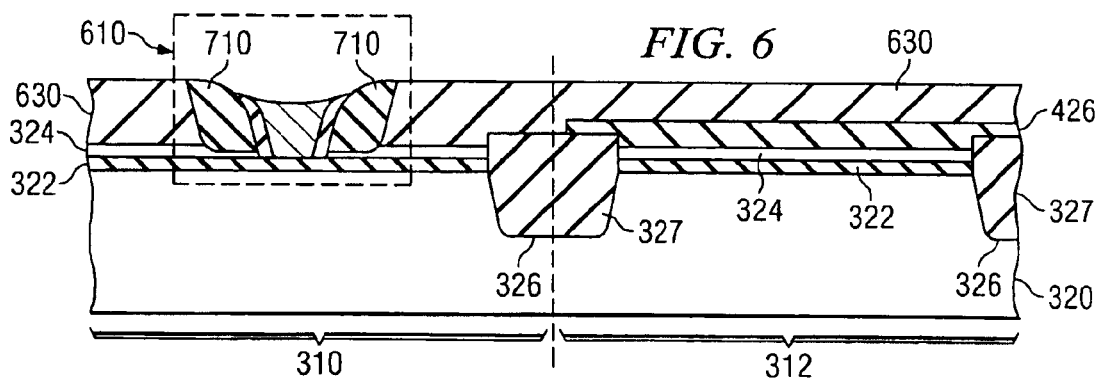

METHOD OF FABRICATING
SEMICONDUCTOR DEVICE WITH
SEPARATE PERIPHERY AND CELL REGION
ETCHING STEPS

TECHNICAL FIELD

The present invention relates to the field of semiconductor devices, and more specifically, to a method of fabricating a semiconductor device via separate periphery and cell region etch processes.

BACKGROUND

Semiconductor memory devices are used in a wide variety of contexts to store user data, device status, program code and data, and the like. Generally, memory devices typically comprise one or more memory cells and associated logic. The memory cells may be fabricated as, for example, capacitors, transistors, a combination thereof, or the like.

FIGS. 1 and 2 illustrate a plan view of one particular type of memory device in which memory cells are arranged in arrays, commonly referred to as a memory array and a cross-section view of a split-gate memory cell, respectively. The memory array includes a floating-gate transistor as the storage device for the individual memory cells. The floating-gate transistor includes a source 114, a drain 116, and a split gate 118. The split gate 118 comprises a gate electrode 120 and a floating gate 122 separated by an inter-gate dielectric 124, which is commonly formed of an oxide and referred to as an inter poly oxide (IPO). The bit line 110 is electrically coupled to the drain, and the source is electrically coupled to a voltage source (not shown) via a conductive layer, such as the polysilicon plug 126. The word line 112 is electrically coupled to the gate electrode 120 and often formed integrally therewith. Adjacent memory cells are typically separated by shallow trench isolations (STI) 128. The STI 128 are generally formed by etching a trench in a substrate and filling the trench with a dielectric material, such as a high-density plasma (HDP) oxide.

It is generally desirable to fabricate the memory cell such that the dielectric material in the STI, referred to as the STI filler, is lower on the cell region side of the STI and higher on the periphery region side of the STI. If the STI filler is too high on the cell region side of the STI, then a poly stringer or residue may result, and if the STI fill is too low on the periphery region side of the STI, then the active region may become pitted or portions of the floating gate may be etched.

Therefore, there is a need for a method of fabricating semiconductor devices having different heights of STI filler at the boundaries of the STI filler.

SUMMARY OF THE INVENTION

These and other problems are generally reduced, solved or circumvented, and technical advantages are generally achieved, by embodiments of the present invention which provides a method of manufacturing semiconductor devices having a different shallow trench isolation (STI) filler height adjacent to the cell region with respect to the STI filler height adjacent to the periphery region.

In one embodiment of the present invention, a semiconductor device is fabricated by forming a protective layer over a polysilicon layer in the periphery region of the semiconductor device and a portion of the STI filler. The semiconductor structures are formed in a second region. A portion of the STI filler in the second region is removed while fabricating the semiconductors in the second region. Upon removing the protective layer and the polysilicon layer in the first region, a different height of STI filler may be obtained in the cell region in reference to the height of the STI filler in the periphery region.

In another embodiment of the present invention, the polysilicon layer is utilized to form semiconductor devices in the first region. In the preferred embodiment, the polysilicon layer is utilized to form the floating gate of a split-gate transistor.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3–9 are cross-section views of various process steps that may be performed to fabricate a semiconductor device with separate etching steps for the periphery region and the cell region in accordance with one embodiment of the present invention.

DETAILED DESCRIPTION OF ILLUSTRATIVE EMBODIMENTS

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

For example, one embodiment of the present invention is a memory device including a memory cell comprising a floating gate transistor, such as a flash electrically erasable programmable read-only memory (flash EEPROM). The discussions that follow describe a process of fabricating semiconductor structures having a first region with one set of STI filler requirements and a second region with a second set of STI filler requirements. In particular, one embodiment of the present invention is described wherein a semiconductor memory having a cell region and a periphery region that have differing STI filler height requirements is fabricated. Embodiments of the present invention, however, may be used for forming other semiconductor devices with similar requirements.

FIGS. 3–9 illustrate cross-section views of a wafer during various steps of one embodiment of the present invention in which the STI level adjacent to a cell region is different that the STI level adjacent to a periphery region in the context of fabricating a flash memory having a floating gate. As discussed above, however, embodiments of the present invention may be utilized to fabricate other types of devices. For purposes of illustration, FIGS. 3–9 illustrate a portion of a cell region 310 and a portion of a periphery region 312. Generally, the cell region 310 includes, for example, a memory cell having storage devices, storage capacitors, storage transistors, and devices required to access the storage devices. The periphery region 312 includes, for example, sense amplifiers, transistors, capacitors, and other logic circuits that control the reading to and writing from the memory cell. Furthermore, the embodiments of the present invention discussed herein are illustrated as n-type semiconductor devices, namely, an NMOS transistor. One skilled in the art, however, will appreciate that aspects of the present invention may be used to form other n-type semiconductor devices or p-type semiconductor devices.

Figure 3:
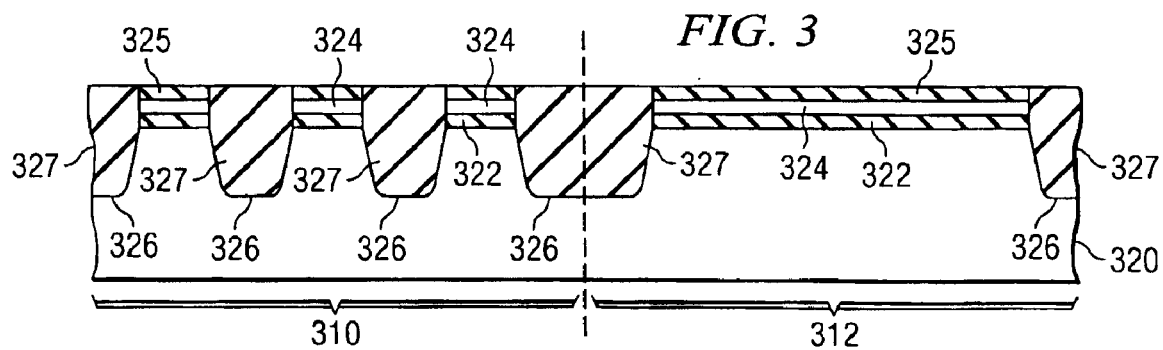

Referring first to FIG. 3, wherein a wafer has been prepared by forming on a substrate 320 a gate insulator layer 322, a gate layer 324 formed on the gate insulator layer 322, and a hard mask 325 formed on the gate layer 324. After the gate insulator layer 322, the gate layer 324, and the hard mask 325 have been deposited, shallow trench isolation structures (STIs) 326 have been formed, preferably by photolithography techniques as is known in the art. The STIs 326 are filled, preferably with a dielectric material such as an oxide material, a high-density plasma (HDP) oxide, or the like, formed by conventional methods. The resulting wafer is planarized, preferably by a chemical-mechanical polishing (CMP) using an oxide slurry wherein the hard mask 325 acts as a stop layer. The hard mask 325 may be removed after the CMP is performed.

The substrate 320 is preferably a silicon substrate, which is typically undoped, but may be lightly doped. Other materials, such as germanium, quartz, sapphire, and glass could alternatively be used for the substrate 320. In a preferred embodiment wherein an n-type semiconductor device is being formed, the substrate 320 is preferably doped with boron ions at a dose of about $2e^{12}$ to about $7e^{1212}$ atoms/cm$^2$ and at an energy of about 20 KeV to about 120 KeV to form a p-well (not shown).

The gate insulator layer 322, which prevents electron depletion, is preferably an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In the preferred embodiment, however, the gate insulator layer 322 is silicon dioxide material formed by wet or dry oxidation process, such as a furnace oxidation in an ambient environment of $O_2$, $H_2O$, a combination thereof, or the like, or an in-situ steam generation (ISSG) process in an ambient environment of $O_2$, $H_2O$, NO, a combination thereof, or the like. In the preferred embodiment, the gate insulator layer 322 is about 40 Å to about 140 Å in thickness, but most preferably about 70 Å to about 100 Å in thickness.

The gate layer 324 is generally a semiconductor material such as polysilicon, amorphous silicon, or the like. In the preferred embodiment, polysilicon is deposited undoped by low-pressure chemical vapor deposition (LPCVD) to a thickness in the range of about 400 Å to about 1400 Å, but most preferably about 600 Å to about 900 Å.

The hard mask 325 is a protective layer to prevent the underlying structures from being removed during an etching process. One such suitable hard mask 325 comprises a nitride layer, such as a silicon nitride ($Si_3N_4$) layer. The $Si_3N_4$ layer may be formed using CVD techniques using silane and ammonia as precursor gases, and deposition temperatures ranging from 550° to 900° Celsius (C). The hard mask 325 may be removed after the CMP process is performed by a wet dip in a solution of phosphoric acid ($H_3PO_4$).

Other mask materials can be used to form hard mask 325. For example, the hard mask 325 could be a nitrogen containing layer other than $Si_3N_4$. For example, the hard mask 325 could comprise silicon nitride $Si_xN_y$, silicon oxynitride $SiO_xN_y$, silicon oxime $SiO_xN_y:H_z$, or a combination thereof.

Referring now to FIG. 4, a protective layer 426 is formed. The protective layer 426 protects the underlying material during subsequent processing steps, such as etching. As will be discussed in greater detail below, the protective layer 426 will be patterned such that the gate layer 324 in the periphery region will be protected, thereby allowing the gate layer 324 located in the cell region 310 to be processed separately from the gate layer 324 located in the periphery region 312. In the preferred embodiment, the protective layer 426 is an oxide or dielectric layer formed by an oxidation process, such as wet or dry thermal oxidation in an ambient comprising an oxide, $H_2O$, NO, a combination thereof, or the like. Most preferably, however, the protective layer 426 is a layer of tetra-ethyl-ortho-silicate (TEOS) formed by plasma-enhanced chemical vapor deposition (PECVD) techniques using is TEOS and oxygen as a precursor. The protective layer 426 is preferably about 200 Å to about 1000 Å in thickness, but most preferably about 300 Å to about 600 Å in thickness.

Referring now to FIG. 5, a patterned mask 528, such as a photoresist mask, is formed on the protective layer 426. The patterned mask 528 preferably comprises a photoresist material that has been masked, exposed, and developed. Generally, a photoresist material is irradiated (exposed) and developed to remove a portion of the photoresist material. The remaining photoresist material protects the underlying material from subsequent processing steps, such as etching.

After the patterned mask 528 has been formed, an etching process is performed to remove the unwanted protective layer 426. In the preferred embodiment illustrated in FIG. 5, the protective layer 426 over the cell region 310 is removed, thereby exposing the underlying gate layer 324 and STI filler 327 within the cell region 310. The etching process is preferably an isotropic wet etch in a solution of a buffer oxide etch (BOE), such as a solution of hydrofluoric acid (HF). Optionally, the isotropic wet etch may be used to etch the STI filler 327 in the cell region 310. By allowing the isotropic wet etch to etch portions of the STI filler 327, different heights of the STI filler 327 may be easily obtained in the cell region 310 and the periphery region 312.

Figure 1:
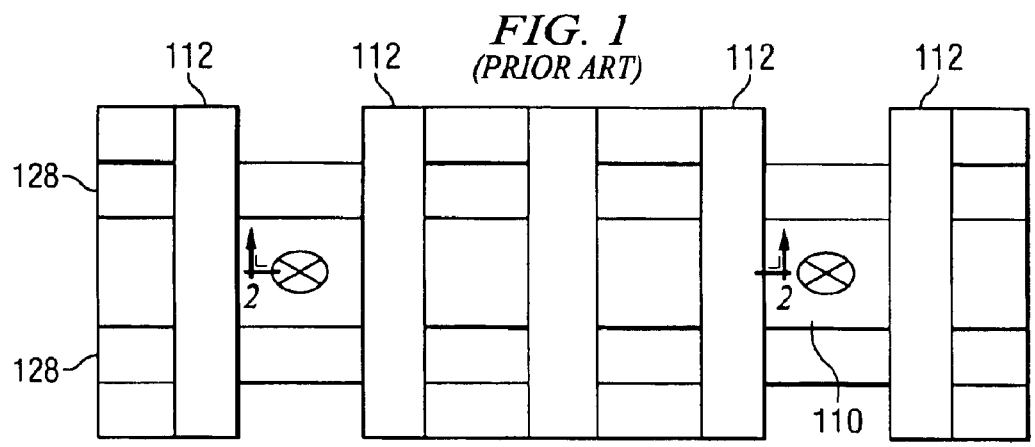
FIG. 1 is plan view of a memory array.

Following the etching process, in accordance with the preferred embodiment in which the gate layer 324 is formed of an undoped polysilicon, a doping step is performed to implant ions into the gate layer 324 to form the floating gate of the floating gate transistor (see FIG. 1). In the preferred embodiment wherein n-type semiconductor devices are being formed, the polysilicon material of the floating gate in the cell region 310 is doped with phosphorous ions at a dose of about $0.5e^{15}$ to about $3e^{15}$ atoms/cm$^2$ and at an energy of about 1 to about 5 KeV. Alternatively, the gate layer 324 may be doped using nitrogen, arsenic, antimony, or the like. N-type semiconductor devices may also be formed by doping the floating gate layer with boron, aluminum, gallium, indium, or the like.

Optionally, the gate layer 324 may be patterned prior to doping to restrict ion implantation to pre-determined areas of the gate layer 324. For example, if multiple devices are being formed that require varying levels of doping or varying types of doping (e.g., N-type doping, P-type doping, no doping, and the like), a mask layer (not shown) may be utilized to selectively dope the gate layer 324.

Upon completion of doping the gate layer, the patterned mask 528 may be removed by an $O_2$ plasma dry strip and a mixture of concentrated sulphuric acid and hydrogen peroxide. Other solutions that may be used to remove the patterned mask 528 include a dilute hydrofluoric acid, a mixture of concentrated sulphuric acid and hydrogen peroxide, or the like.

Figure 2:
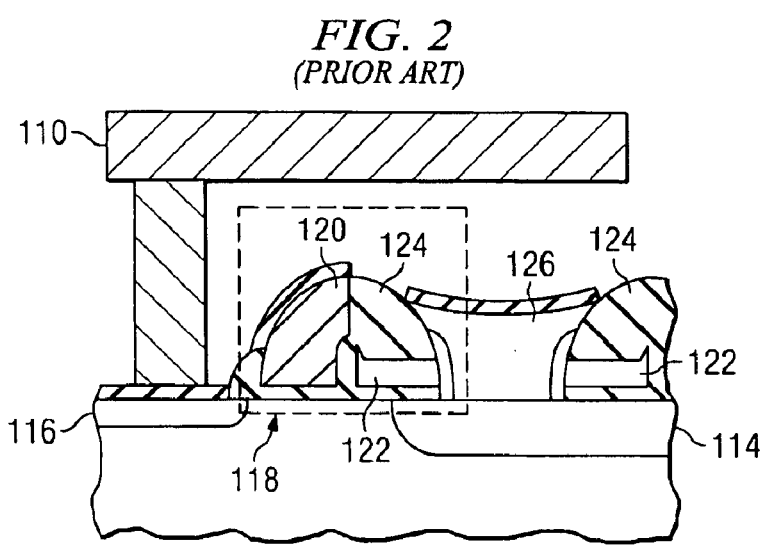
FIG. 2 is a cross-section view of a portion of the memory array illustrated in FIG. 1.

Referring now to FIG. 6, a hard mask 630 is formed, and the structures 610 in the cell region 310 are formed. The structures 610, for example, include the formation of the source poly, the floating gate, the gate electrode, and the inter-gate dielectric of a split-gate transistor as discussed above with reference to FIG. 1. It is noted that for the purpose of illustration, FIGS. 6–9 are cross-section views along an axis perpendicular to FIGS. 3–5, which are taken along the axis illustrated in FIGS. 1 and 2.

The hard mask 630 is a protective layer to prevent the underlying structures from being removed during an etching process. One such suitable hard mask layer 630 is a silicon nitride ($Si_3N_4$) layer. The $Si_3N_4$ layer may be formed, for example, using CVD techniques with silane and ammonia as precursor gases, and deposition temperatures ranging from 650° to 850° Celsius (C). The hard mask 630 may be formed of other mask materials, such as a nitrogen containing layer other than $Si_3N_4$. For example, the hard mask 630 could comprise silicon nitride $Si_xN_y$, silicon oxynitride $SiO_xN_y$, silicon oxime $SiO_xN_y:H_z$, or a combination thereof.

After the hard mask 630 is formed, the desired structures located within the cell region 310 are formed. In the preferred embodiment in which a flash memory cell is being formed in the cell region 310, the memory cell may be formed utilizing standard processes as is known in the art. Because the hard mask 630 protects the periphery region 312, the processes utilized to form the memory cell may be designed to optimize the formation and the operating characteristics of the memory cell components. Embodiments of the present invention, however, are particularly useful in the formation of floating gate transistors in the cell region 310 wherein the formation of the split gates and the height of the STI filler 327 may be individually processed. One possible split-gate transistor design is discussed above in reference to FIG. 1.

Figure 7:
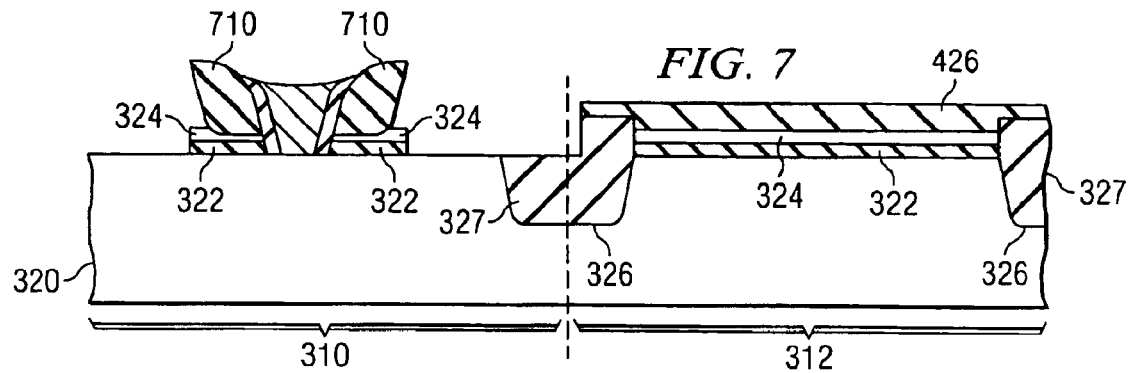

Referring now to FIG. 7, the hard mask 630 (FIG. 6) is removed and the exposed portions of the gate layer 324 in cell region 310 are etched. Note that the portion of the gate layer 324 that forms the floating gate 122 (FIG. 1) in the cell region 310 is protected by an oxide layer 710 that is formed during normal processing steps. Similarly, the gate layer 324 located in the periphery region 312 remains protected by the protective layer 426.

One commonly used method of removing the hard mask 630 is a wet dip in a phosphoric acid solution of phosphoric acid ($H_3PO_4$) and water ($H_2O$). Other solutions that may be used to remove the hard mask 630, include, for example, a dilute hydrofluoric acid, a mixture of concentrated sulphuric acid and hydrogen peroxide, or the like.

The exposed portions of the gate layer 324 are preferably removed by an isotropic dry etch process. Generally, the isotropic dry etch process has been found to provide a sharp floating gate polysilicon tip and a controllable floating gate critical dimension in the cell region 310. Because the gate layer 324 located in the periphery region 312 is protected during the etching process, the floating gate can be processed in a manner that optimizes the floating gate operating characteristics, and prevent pitting or poly residue in the periphery region 312 that may otherwise occur.

Figure 8:
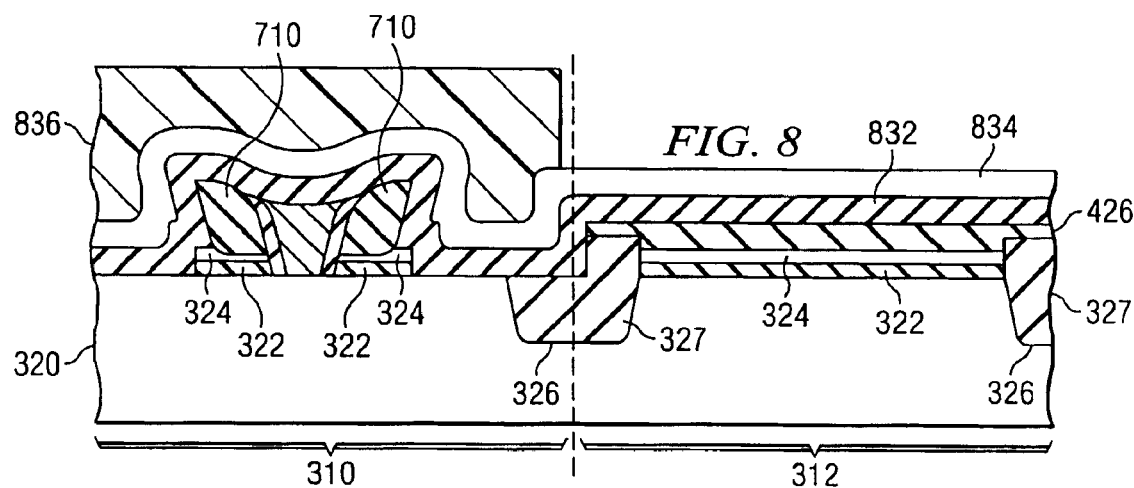

Referring now to FIG. 8, an inter-poly oxide layer 832 and a cell gate poly layer 834 are formed, and a mask layer 836 is patterned. Preferably, the inter-poly oxide layer 832 comprises an oxide formed by wet or dry oxidation process, such as a furnace oxidation in an ambient environment of $O_2$, $H_2O$, a combination thereof, or the like, or an in-situ steam generation (ISSG) process in an ambient environment of $O_2$, $H_2O$, NO, a combination thereof, or the like. In the preferred embodiment, the inter-poly oxide layer 832 is formed by furnace high temperature oxide (HTO). The inter-poly oxide layer 832 may also be formed by CVD in an ambient of $SiH_2Cl_2$ and $N_2O$. The inter-poly oxide layer is preferably about 100 Å to about 200 Å in thickness, but most preferably about 120 Å to about 170 Å in thickness.

The cell gate poly layer 834 may be, for example, deposited by furnace deposition of an in-situ undoped polysilicon to a thickness about 1000 Å to about 2200 Å, but most preferably about 1300 Å to about 2000 Å in thickness. The polysilicon is preferably doped in a later step during source/drain implant process steps as is known in the art.

Optionally, the cell gate poly layer 834 may be deposited undoped and patterned prior to doping to restrict ion implantation to pre-determined areas of the cell region 310. For example, if multiple devices are being formed that require varying levels of doping or varying types of doping (e.g., N-type doping, P-type doping, no doping, and the like), a mask layer (not shown) may be utilized to selectively dope the cell gate poly layer 834.

The mask layer 836, preferably a photoresist mask, is deposited over the cell region 310 to protect the cell region 310 from subsequent processing steps performed to fabricate the periphery region 312.

Figure 9:
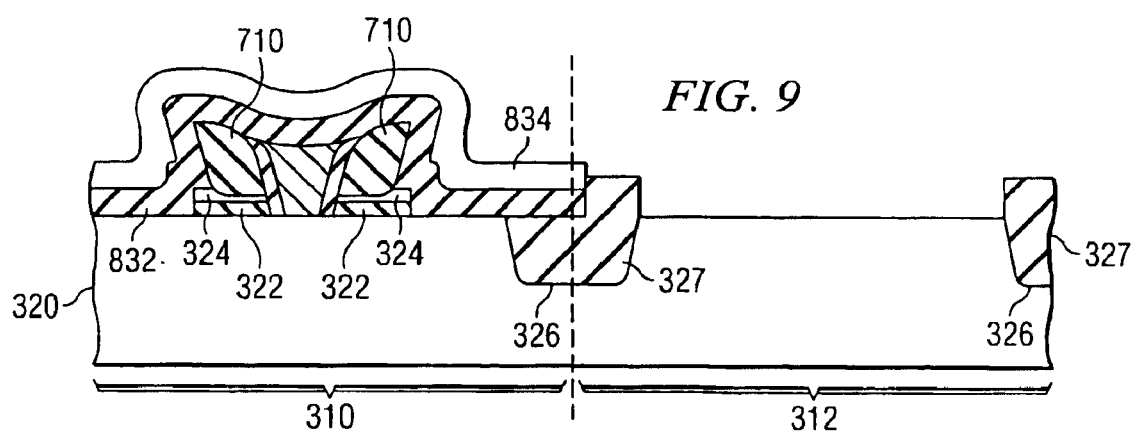

Referring now to FIG. 9, the inter-poly oxide layer 832, the cell gate poly layer 834, the protective layer 426, and the gate layer 324 in the periphery region 312 are removed. The cell gate poly layer 834 may be removed by performing an anisotropic plasma etch process using an ambient environment of HBr and $O_2$, or the like, wherein the inter-poly oxide layer 832 acts as a stop layer. The inter-poly oxide layer 832 and protective layer 426 may be removed by performing an anisotropic plasma etch process using an ambient environment of $CF_4$, $C_2F_6$, a mixture of $C_xF_y$ and $O_2$, or the like, wherein the gate layer 324 acts as a stop layer. Optionally, the etch time of the etching process to remove the inter-poly oxide layer 832 and protective layer 426 may be adjusted to control the STI oxide level in the periphery region 312 for the subsequent gate layer 324 on periphery.

The gate layer 324 is preferably removed via an isotropic etch, using a mixture of $CF_4$, $C_2F_6$, and $O_2$ plasma. The $CF_4$, $C_2F_6$, and $O_2$ plasma solution exhibits a high etch selectivity between the gate layer 324 and the gate insulator layer 322, which acts as a etch stop. Using an isotropic plasma etch with high selectivity between the gate layer 324 and the gate insulator layer 322 allows removal of the gate layer 324 without pitting or poly residue.

Thereafter, standard processes may be used to complete fabrication of the semiconductor device.

As one skilled in the art will appreciate, the height of the STI filler 327 is different in the cell region 310 and the periphery region 312. The different heights of the STI filler 327 allows each height to be individually determined to reduce the poly stringers and the pitting in the cell region and/or periphery region.

Although particular embodiments of the invention have been described in detail, it is understood that the invention is not limited correspondingly in scope, but includes all changes, modifications, and equivalents coming within the spirit and terms of the claims appended hereto. For example, different types of materials may be used for the masks and device layers, different etching processes may be used, other types of devices may be fabricated, other types of structures may be fabricated, and the like. Accordingly, it is understood that this invention may be extended to other structures and materials, and thus, the specification and figures are to be regarded in an illustrative rather than a restrictive sense.

What is claimed is:

1. A method of forming a semiconductor device, the method comprising:

providing a substrate with one or more shallow trench isolations (STI) formed thereon;

forming a protective layer on a first region of the substrate, the first region encompassing a portion of at least one STI;

forming one or more semiconductor structures in a second region, the second region not being covered by the protective layer; and removing the protective layer;

wherein the portion of the STI located in the second region is partially removed with respect to the STI located in the first region.

2. The method of claim 1 wherein the semiconductor device is a memory cell.

3. The method of claim 1 wherein the semiconductor device includes a floating gate transistor.

4. The method of claim 1 wherein the protective layer is an oxide.

5. A method of forming a semiconductor device, the method comprising:

providing a substrate with one or more shallow trench isolations (STI) filled with a dielectric material formed therein, the substrate having an oxide layer and a first poly layer formed thereon;

forming a protective layer on the first poly layer in a first region of the substrate;

fabricating in a second region one or more semiconductor structures, the semiconductor structures utilizing at least one of the first poly layer and the oxide layer in a second region, the second region not being covered by the protective layer;

forming on the substrate a second poly layer; and removing the first poly layer, the protective layer, and the second poly layer from the first region.

6. The method of claim 5 wherein the dielectric material adjacent to the first region is a different height than the dielectric material adjacent to the second region.

7. The method of claim 5 wherein the semiconductor structures include a memory cell.

8. The method of claim 5 wherein the semiconductor structures include a floating gate transistor.

9. The method of claim 5 wherein the protective layer is an oxide.

10. The method of claim 5 further comprising the step of doping the first poly layer in the second region.

11. The method of claim 5 wherein the step of removing the second poly layer is performed by an anisotropic etching step.

12. The method of claim 5 wherein the step of removing the oxide layer is performed by an anisotropic etch process.

13. The method of claim 5 wherein the first region is a periphery region of a memory device and the second region is a cell region of the memory device.

14. A method of forming a semiconductor device, the method comprising:

providing a substrate with one or more shallow trench isolations (STI) filled with an STI filler formed therein, the substrate having an oxide layer formed on the substrate and a first poly layer formed on the oxide layer;

forming a protective layer on the first poly layer and the STI filler in a first region of the substrate;

implanting exposed portions of the first poly layer;

fabricating in a second region one or more semiconductor structures such that the STI filler located in the second region is partially removed; and removing the protective oxide, and the first poly layer.

15. The method of claim 14 wherein the semiconductor device is a memory array.

16. The method of claim 14 wherein the semiconductor device includes a floating gate transistor.

17. The method of claim 16 wherein the device layers include an inter-poly oxide layer and a gate poly layer.

18. The method of claim 14 wherein the protective layer is an oxide.

19. The method of claim 14 wherein the first region is a periphery region of a memory device and the second region is a cell region of the memory device.

20. The method of claim 14 wherein the step of removing the second poly layer is performed by an anisotropic etching step.

21. The method of claim 14 wherein the step of removing the oxide layer is performed by an anisotropic etch process.

22. The method of claim 14 wherein the step of removing the protective layer is performed by an anisotropic etch process.

23. The method of claim 14 wherein the step of removing first poly layer is performed by an isotropic etch process.

* * * * *